US005350964A

United States Patent [19]

Hara et al.

[11] Patent Number: 5,350,964

[45] Date of Patent: Sep. 27, 1994

[54] ULTRASONIC TRANSDUCER AND METHOD OF MANUFACTURING THE SAME

[75] Inventors: Yasushi Hara, Kawasaki; Kazuhiro Watanabe, Tokyo; Hiroshi Ishikawa; Kiyoto Matsui, both of Kawasaki; Kenji Kawabe, Yokohama; Takaki Shimura, Machida, all of Japan

[73] Assignee: Fujitsu Limited, Kawasaki, Japan

[21] Appl. No.: 651,390

[22] PCT Filed: Oct. 11, 1990

[86] PCT No.: PCT/JP90/01314

§ 371 Date: Mar. 8, 1991

§ 102(e) Date: Mar. 8, 1991

[87] PCT Pub. No.: WO91/13524

PCT Pub. Date: Sep. 5, 1991

[30] Foreign Application Priority Data

Feb. 28, 1990 [JP] Japan .................................. 2-047477

[51] Int. Cl.[5] ...................... H04R 31/00; H01L 41/08; H01L 41/22

[52] U.S. Cl. .................................... 310/357; 29/25.35

[58] Field of Search ......................... 310/357; 29/25.35

[56] References Cited

U.S. PATENT DOCUMENTS

| | | | |
|---|---|---|---|
| 2,928,068 | 3/1960 | Samsel et al. | 310/358 |
| 2,956,184 | 10/1960 | Pollack | 310/358 |
| 4,443,733 | 4/1984 | Samodovitz | 310/369 |
| 4,460,841 | 7/1984 | Smith et al. | 310/334 |
| 4,509,153 | 4/1985 | Weight | 310/357 |
| 4,518,889 | 5/1985 | 'T Hoen | 310/357 |
| 4,783,888 | 11/1988 | Fujii et al. | 310/334 |
| 4,961,252 | 10/1990 | Hsu et al. | 310/359 |

FOREIGN PATENT DOCUMENTS

| | | | |
|---|---|---|---|
| 2431189 | 3/1980 | France | 29/25.35 |
| 59-77800 | 5/1984 | Japan . | |
| 62-231591 | 10/1987 | Japan . | |
| 64-6858 | 1/1989 | Japan . | |

OTHER PUBLICATIONS

Ultrasonics, vol. 25, No. 2, Mar. 1987, Guildford, GB, "Fabrication of Non-Uniformly Excited Wide-Band Ultrasonic Tranducers", R. H. Brittain et al., pp. 100-106.

ISAF '86 Proceedings of the Sixth IEEE International Symposium on Applications of Ferroelectrics, Jun. 1986, LeHigh University, Bethlehem, Penn., USA, "Composite Piezoelectric Materials for Medical Ultrasonic Imaging Tranducers-A Review", W. A. Smith, pp. 249-255.

*Primary Examiner*—Kristine L. Peckman
*Assistant Examiner*—C. LaBalle
*Attorney, Agent, or Firm*—Staas & Halsey

[57] ABSTRACT

The present invention realates to an ultrasonic transducer providing a plurality of arranged vibrators as the piezoelectric materials. The present invention easily provide the shading to the polarization in the elevation direction of the piezoelectric materials in order to narrow the beam transmitted from the transducer. For this purpose, a structure of the present invention provides for the polarization ($V_1$, $V_2$, $V_3$) of piezoelectric material of arranged vibrators to be gradually reduced in mass like a staircase from the center of the arranged vibrators to both end portions in the direction orthogonally crossing the arrangment direction of a plurality of arranged vibrators.

7 Claims, 15 Drawing Sheets

ULTRASONIC TRANSDUCER AND METHOD OF MANUFACTURING THE SAME

BACKGROUND OF THE INVENTION

1. Field of The Invention

The present invention relates to improvement of an ultrasonic beam in the elevation direction of an ultrasonic transducer and more specifically to the shading of an electromechanical coupling coefficient in the elevation direction of a piezoelectric vibrator of an ultrasonic transducer.

2. Description of The Related Art

In view of improving an ultrasonic beam, namely reducing side lobe level of ultrasonic beam, polarization of arranged vibrators forming an ultrasonic transducer as a piezoelectric material has been lowered or reduced in mass toward the end portion of the transducer from the center in the direction orthogonally crossing the arrangement direction of vibrators (namely, in the elevation direction of ultrasonic transducer, and in the elevation direction of a probe).

FIG. 1(*a*) indicates an example of such a structure. In this figure, the vertical axis indicates an electromechanical coupling coefficient, while the horizontal axis indicates the direction orthogonally crossing the arrangement direction of vibrators forming an ultrasonic transducer as the piezoelectric material (namely, elevation direction of ultrasonic transducer, and elevation direction of probe). In FIG. 1(*a*), the polarized distribution of coupling coefficient is similar to the Gaussian function. Namely, polarization is carried out so that the distribution of electromechanical coupling coefficient kt (hereinafter referred to as coupling coefficient) of vibrators arranged is gradually reduced as the polarization goes to the end portion of the transducer from the center. An acoustic pressure from the ultrasonic transducer in such polarization is shown in FIGS. 3 (*a*), (*b*). FIG. 3(*a*) indicates the ultrasonic beam irradiating direction on the horizontal axis and elevation direction of arranged vibrators (direction orthogonally crossing the arrangement direction) on the vertical axis. The acoustic beam profiles in the graph respectively show +20 dB, +10 dB, −10 dB, −20 dB. FIG. 3(*b*) indicates a distribution of an acoustic pressure in the area separated by 140 mm from the arranged vibrators, namley the sectional view of the acoustic pressure at the point corresponding to elevation direction of arranged vibrators separated by 140 mm from the arranged vibrators in FIG. 3(*a*). The vertical axis of FIG. 3(*b*) indicates acoustic pressure, while the horizontal axis indicates the elevation direction (direction orthogonally crossing the arrangement) of the arranged vibrators.

FIG. 1(*b*) indicates an example where the polarization of arranged vibrators is uniform for the elevation direction (without shading). The acoustic pressure graph of acoustic beam profile in this case is shown in FIGS. 4(*a*), and 4(*b*). The graphs of FIGS. 4(*a*), and 4(*b*) indicate just like FIG. 3(*a*) and 3(*b*).

In comparison of these graphs, it is understood that the side lobe level is high when the coupling coefficient is not shaded (comparison in FIG. 3(*b*) and FIG. 4(*b*)) and that the-beam is not converged (comparison in FIG. 3(*a*) and FIG. 4(*a*)).

As the method (*a*) for changing polarization of arranged vibrators, a method has been proposed by D.K. Hsu in IEEE shown in FIG. 2 on Oct. 9, 1989 ("IEEE 1989 ULTRASONIC SYMPOSIUM AND SHORT COURSES, PROGRAM AND ABSTRACTS NON-UNIFORMLY POLED GAUSSIAN BESSEL FUNCTION TRANSDUCERS"). First, a piezoceramics 102, which is sufficiently thicker than the desired elevation and has the spherical recessed area at a single side, is manufactured. Next, an Ar/Cr film 105 is evaporated to or placed on both sides of piezoelectric ceramics. A spherical electrode 101 matching with the shape of curvature of the recessed area is provided to the spherically arcuated surface of the ceramic and a flat electrode 104 is provided in the opposite side to the spherically arcuated surface for polarization. The ceramic is polarized. Thereafter, a flat piezoelectric ceramic can be obtained by polishing or cutting the material to the determined elevation t. Thereby, the coupling coefficient can gradually be reduced from the center of the piezoelectric material to the end portion and amplitude shading can be realized.

As the other method, Published Japanese Patent No. 24479/1989 "Linear Phased Array Ultrasonic Transducer" proposes four additional methods; (b) a method where polarization is carried out by applying a high voltage pulse of long duration to a material and thereafter a low voltage pulse is applied for monitoring polarization of the element; (c) a method where a nonuniform high voltage polarization field is applied to a piezoelectric ceramic plate so that the field becomes maximum at the center of the array and the field is lowered or reduced in intensity at the both end portions and in this case, the polarization apparatus is formed by spherically arcuated plate provided with a dielectric material at both end portions or (d) a method similar to method (c) where the polarization apparatus is formed by a flat resistance material to which a voltage is applied to the side where the piezoelectric ceramic is provided; and (e) a method where a piezoelectric material is polarized so that the coupling coefficient becomes uniform, thereafter a temperature gradient is applied to the piezoelectric ceramic by heating both end portions of piezoelectric material and cooling the center. As a result, the polarization of piezoelectric ceramic is stably and uniformly polarized and then reduced adequately depending on the position thereof.

In the methods (a)–(e) explained above, for the shading function, a function which becomes high in the center and becomes low at both end portions, for example, the continuous function such as square cosine ($Y = \cos^2(X)$), Humming function or Gaussian function, etc. is used. Therefore, the surface of piezoelectric ceramics must have the continuous voltage distribution depending on the function at the time of polarization. In this case, the following problems are generated in each method.

In the case where the ceramic is formed by the method (a) proposed by D.K. Hsu, first it is difficult to provide or produce the spherically arcuated surface in the ceramic 1. Second, it is also difficult to provide a spherical electrode to the spherically arcuated surface. Third, unwanted portion is cut out after polarization and polished up to the desired thickness. They require more steps than those in the uniform polarization. As explained above, manufacture is difficult and more steps are required.

The method (b) of applying high voltage pulse also requires more period and steps because the high voltage pulse is repeatedly applied while the result is monitored for each application of pulse.

In the method (c) using a dielectric material, the surface of the piezoelectric ceramic must be brought in contact with high accuracy to the surface of dielectric material for the polarization. Namely, it is thought that polarization is interfered or disturbed due to very small nonuniformity and small size of dust or other particles, or warpage of ceramics and dielectric material, etc.

In case a resistance material is used as proposed in the method (d), the surface of resistance material must be brought in contact with high accuracy to the surface of ceramics just like the case where dielectric material is used.

In the method (e) where temperature gradient is applied to the material, in the arrangement direction, it may be thought that polarization at the end portion is not reduced more than the center, comparison between the center and end portions because the more quantity of heat is released from the end portion. Namely, it is difficult to form uniform polarization to all arranged vibrators in the arrangement direction. Moreover, since a constant temperature gradient must be maintained for a certain long period, control becomes difficult and more steps are required.

As explained above, it is very difficult to manufacture the vibrators to give distribution of polarization intensity depending on the continuous function.

SUMMARY OF THE INVENTION

It is an object of the present invention to provide a transducer which may be manufactured easily employing a staircase function in place of a continuous function as the shading function and provide the shading effect similar to that obtained by employing a continuous function and a method of manufacturing the same.

In order to realize such object, the present invention proposes an ultrasonic transducer consisting of arranged vibrators formed by a plurality of piezoelectric materials which is characterized in that polarization of piezoelectric materials as the arranged vibrators is reduced step by step from the center of the arranged vibrators to the end portions in the direction orthogonally crossing the arrangement direction of a plurality of arranged vibrators.

FIG. 5 is a diagram indicating the principle of the first means. The numeral 1 denotes arranged vibrators and a graph indicated under the vibrators shows shading of polarization in the direction orthogonally crossing the arrangement direction of arranged vibrators.

The arranged vibrators are divided into a plurality of sections in the direction orthogonally crossing the arrangement direction of a plurality of arranged vibrators and any one of divided sections is selected. Thereby, the present invention also proposes a structure that an aperture of arranged vibrators is switched.

Moreover, the present invention also proposes a method of manufacturing a piezoelectric material comprising the first process for providing a plurality of conductor with intervals on the first surface of the piezoelectric material; a second process for uniformly providing conductive materials to the second surface opposed to or opposite the first surface; and a third process for realizing polarization by applying a voltage, which becomes or reduced step by step, from the good conductor located at the center to the good conductor located at both end portions among a plurality of conductors provided at the first surface.

In addition, the present invention is also characterized in that the polarization intensity applied to the piezoelectric material is changed step by step in the range from 2 to 6 staircases or steps.

Moreover, the present invention is also characterized in that the arranged vibrators change, in the elevation direction, step by step in varying or different two or more widths.

DESCRIPTION OF THE PREFERRED EMBODIMENT

Figure 6A:
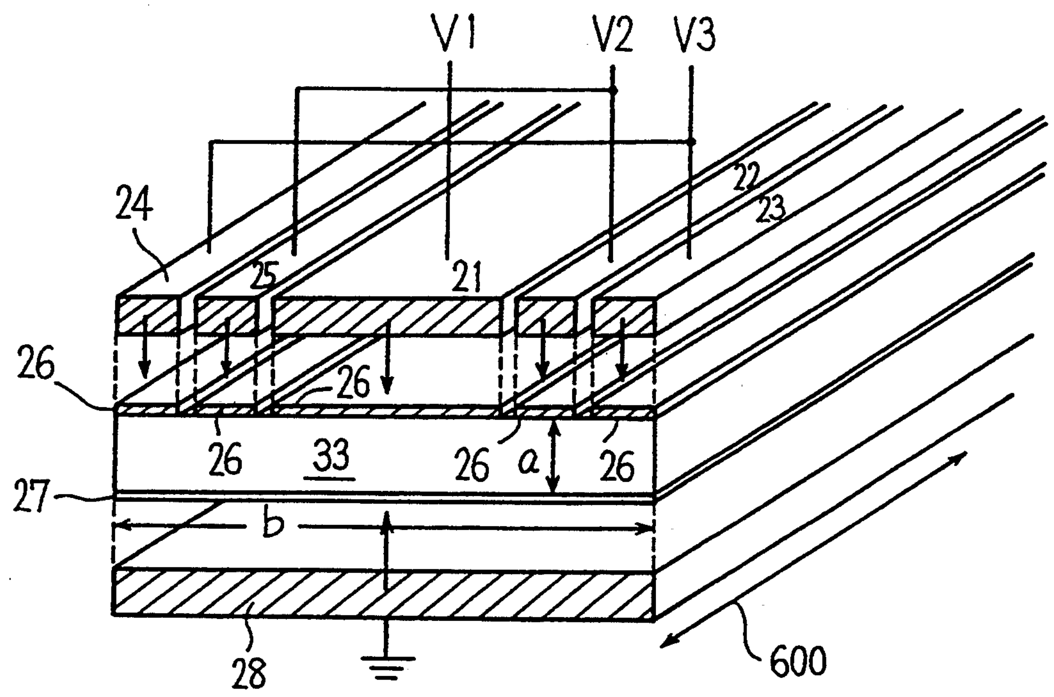
FIGS. 6(*a*) and 6(*b*) are diagrams for explaining manufacture of arranged vibrators.
Figure 6B:
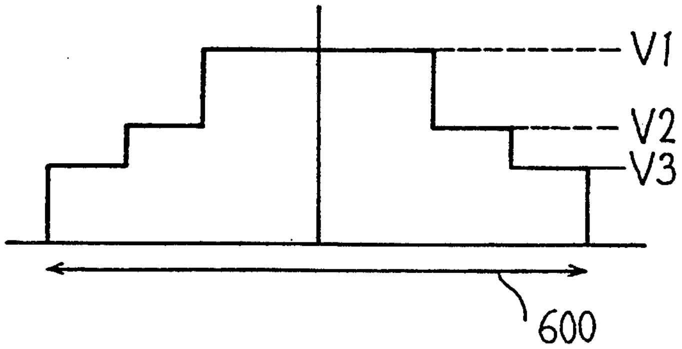

A preferred embodiment of the present invention will next be explained. FIG. 6(*a*) is a diagram for explaining the manufacture of a transducer shading the polarization in step by step (staircase function). The arrow mark 600 supplementing the drawings indicates the arrangement direction of vibrators. In this figure, the arrow mark a indicates elevation of a ceramics 33. The arrow mark b indicates elevation direction orthogonally crossing the arrangement direction 600 of the vibrators. Numeral 33 denotes ceramics; 21, 22, 23, 24, 25, 28, flat electrode; 26, conductor and 27, ceramics.

(1) First, a ceramics 33 is manufactured by the method similar to the method of uniform polarization.

(2) Thereafter, a striped conductor is formed, by the silver baking or plating, etc., with a certain interval in the elevation direction in the side of positive electrode (arrangement direction, scanning direction). In FIG. 6(*a*), such conductor is denoted by numeral 26 and five conductors in total are formed. Moreover, a conductor 27 is formed all through the earth side.

(3) The flat electrodes 24, 25, 21, 22, 23, 28 are applied matching with the shape of respective conductors.

(4) Polarization is carried out by applying a voltage. In this case, the voltage $V_1$ is applied to the flat electrode 21, while the voltage $V_2$ to the flat electrodes 25, 22 and the voltage $V_3$ to the flat electrodes 24, 23.

FIG. 6(*b*) is a diagram for explaining the voltage applied during manufacture in relation to FIG. 6(*a*). The vertical axis indicates a voltage to be applied and the arrow mark 6001 given supplementarily indicates the elevation direction of ceramics 33. The voltage applied in this case becomes maximum at the center and is gradually reduced step by step as it goes to the both end portions of the piezoelectric material ($V_1>V_2>V_3$). In case the method explained above is compared with the method of uniform polarization in the point of easiness of manufacture, the ceramics can be realized or manufactured easily only with increase in the staircase for providing the conductor in accordance with the width of staircase in staircase function.

Next, polarization, electromechanical coupling coefficient, acoustic pressure and shading function will be explained. A high voltage is applied to the piezoelectric element used ordinarily so that vibrators are sufficiently polarized. However, when the coupling coefficient value, while the array element is sufficiently polarized, is set to 100 by conducting polarization through change of applied voltage, the coupling coefficient may be changed from 20 to 100 depending on the applied voltage. With a method of changing the coupling coefficient by changing the voltage to be applied, polarization is carried out so that it is sufficiently polarized at the center and the applied voltage is reduced step by step as it goes to both end portions. Thereby,the coupling coefficient can be distributed in the form of a staircase function. Moreover, since this coupling coefficient is proportional to the acoustic pressure of transmission and reception, when it is given the distribution, the transmitting acoustic pressure and receiving acoustic pressure of ultrasonic wave can be shaded depending on distribution of such coupling coefficient.

Figure 9:
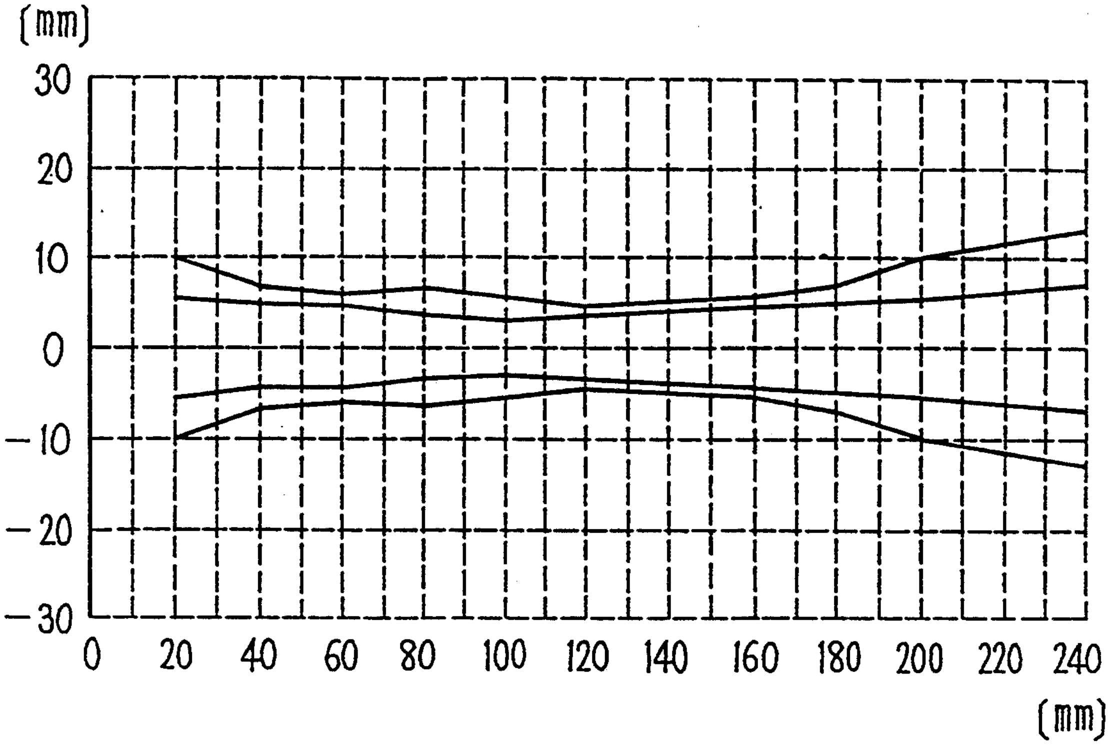
FIG. 9 shows acoustic beam profile when polarization is carried out in three stages.

An acoustic pressure of beam at the arranged vibrators manufactured by this method is shown in FIG. 9. FIG. 9 shows acoustic pressure distribution of beam at each depth in case the shading of polarization is set in three staircases. In the case of polarization in three staircases, a value of electromechanical coupling coefficient in each staircase is desirable to be set as follow. Namely, when the electromechanical coupling coefficient of the first staircase is set to 70%, the electromechanical coupling coefficient of the third staircase is set to 28% and that of second staircase to 42%. FIG. 9 indicates like FIG. 3(*a*) and FIG. 4(*a*). When the shading is made in three staircases as shown in FIG. 9, the beam is obviously narrowed in comparison with the case without the shading (FIG. 4(*a*). It is also obvious that such shading is very similar to the shading in the Gaussian function (FIG. 3(*a*). Accordingly, even in case the shading is made in step by step, the effect of beam narrowing just like the Gaussian function can easily be obtained.

Figure 7:
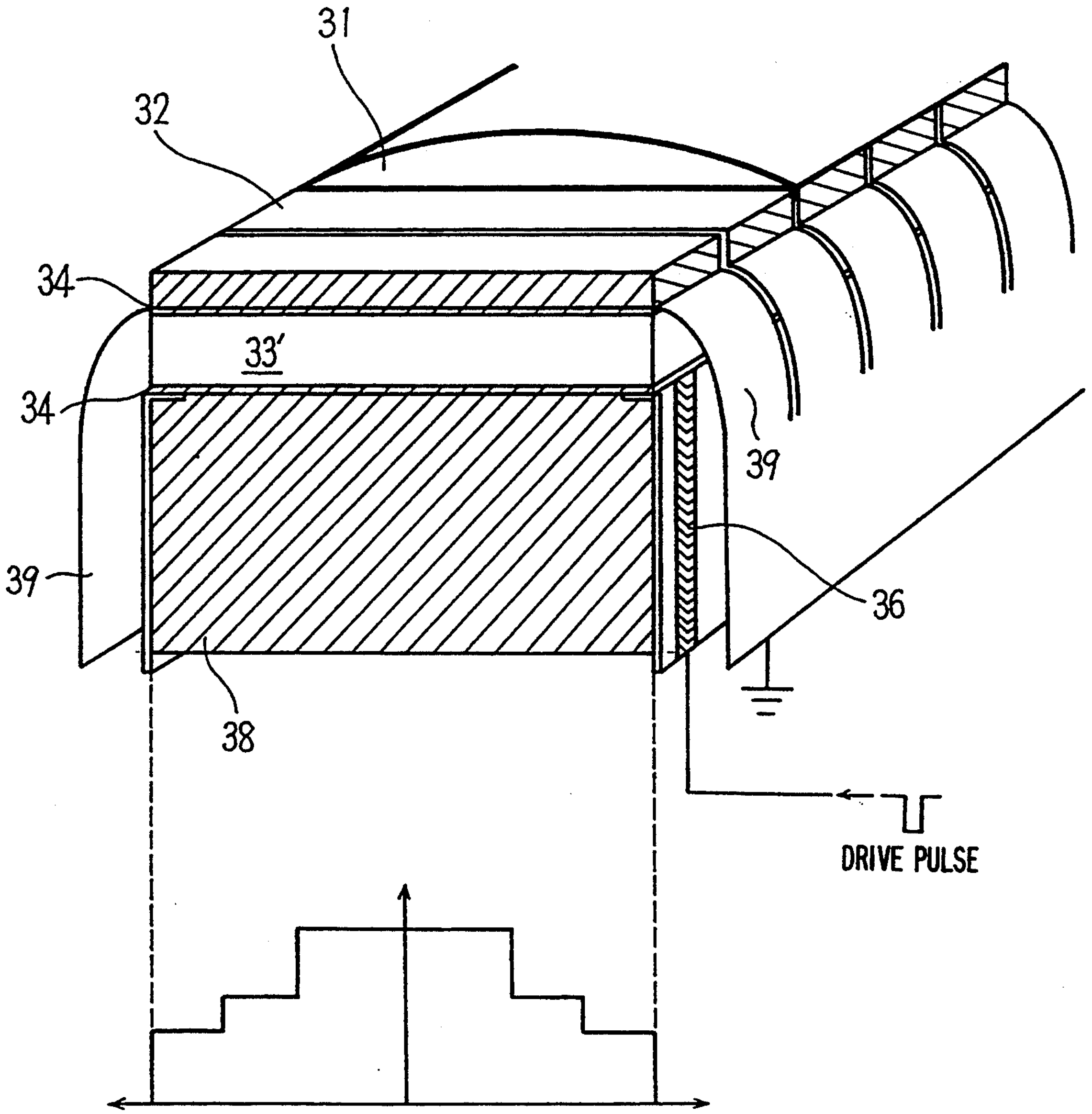
FIG. 7 is an embodiment of a piezoelectric element of the present invention.

FIG. 7 shows a probe utilizing the arranged vibrators for which polarization is shaded using an embodiment of the present invention.

In FIG. 7, the numeral 31 denotes acoustic lens; 32, matching layer; 33', piezoelectric ceramics in which polarization is shaded using at the staircase function; 34, electrode; 36, signal line to electrode; 39, earth and 38, backing for attenuating ultrasonic output to the opposite side of the acoustic lens. With use of such structure, the beam of acoustic pressure distribution shown in FIG. 9 can be transmitted or obtained.

Figure 8:
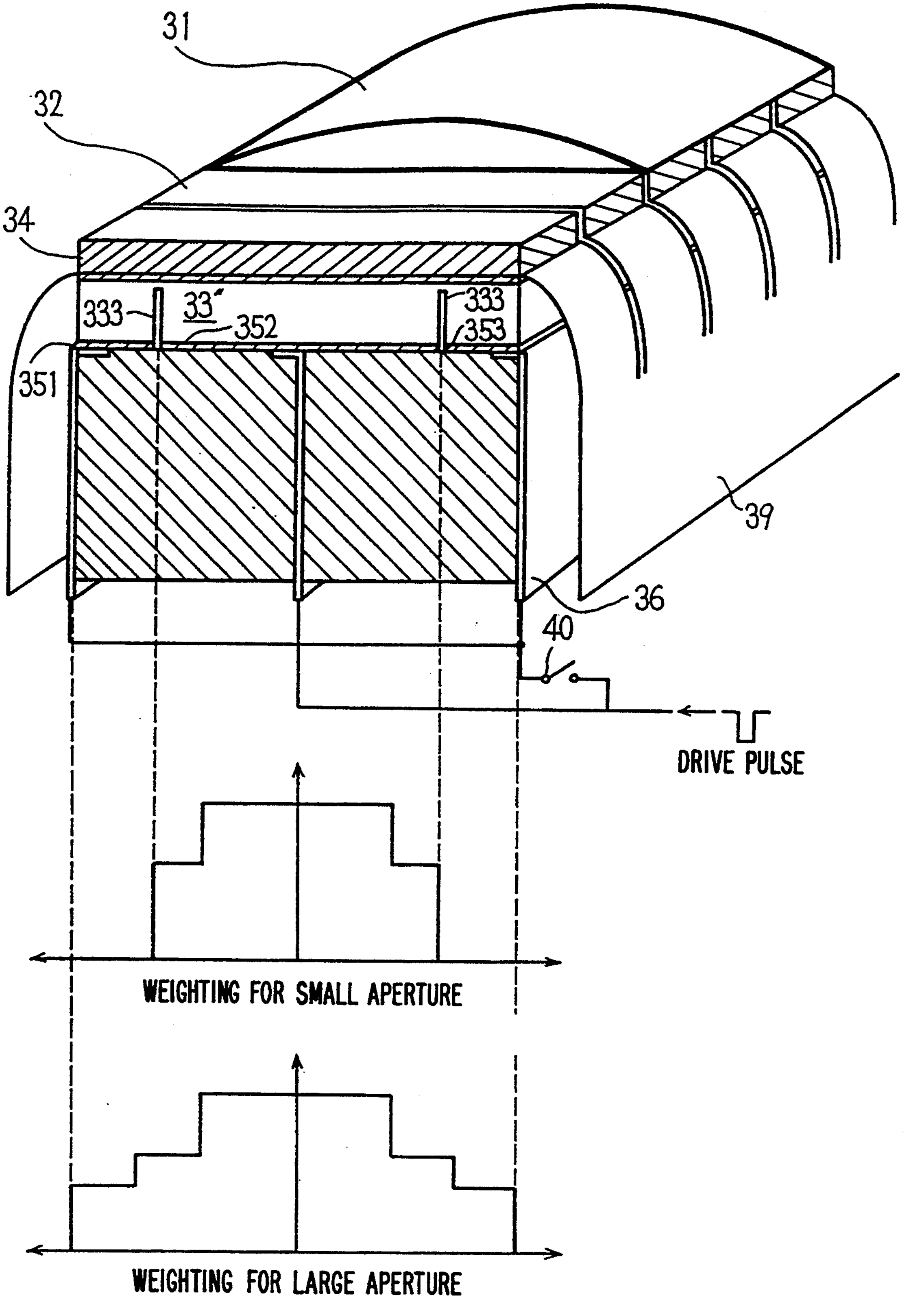
FIG. 8 is an embodiment of an aperture control.

FIG. 8 indicates a structure for selectable aperture in the elevation control using a piezoelectric ceramics element for which the polarization is shading in the staircase function in the elevation direction of arranged vibrators (direction orthogonally crossing the scanning direction). The elements like those in FIG. 3 are denoted by the like or same numerals.

The piezoelectric ceramics 33" is provided with the cuttings 333. A certain gap is also given between the electrodes 351, 352, 353 resulting from the cuttings 333. When a switch 40 is turned ON, an aperture becomes large and when the switch is turned OFF, the aperture becomes small. The graphs of shading for large aperture or small aperture are shown in FIG. 8.

Figure 1A:
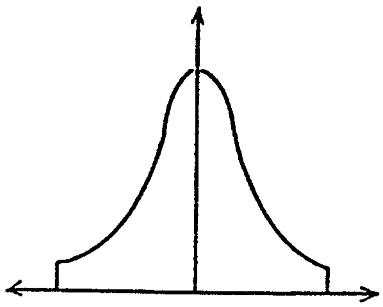
FIGS. 1(*a*) and 1(*b*) are diagrams for explaining polarization.
Figure 1B:
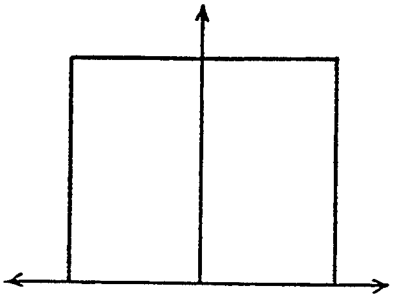
Figure 2:
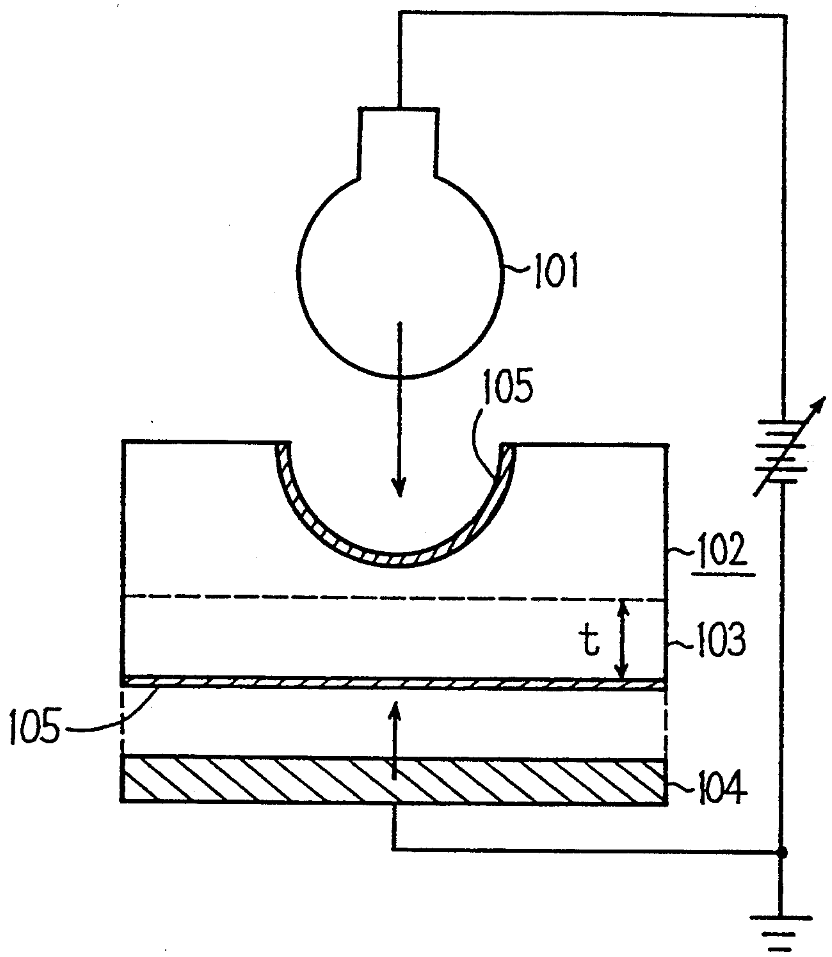
FIG. 2 is a diagram for explaining the prior art by D.K. Hus.
Figure 3A:
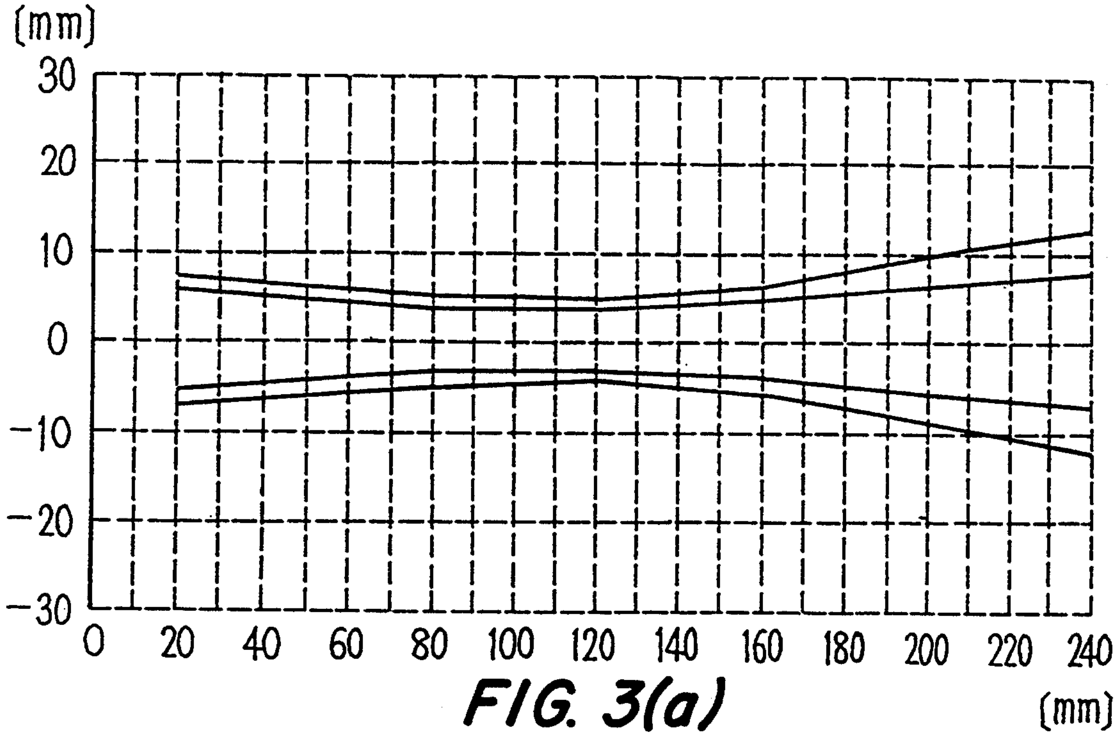
FIG. 3(*a*) and 3(*b*) are diagrams for explaining acoustic pressure when an ultrasonic transducer in polarization conforming to the Gaussian function is employed.
Figure 3B:
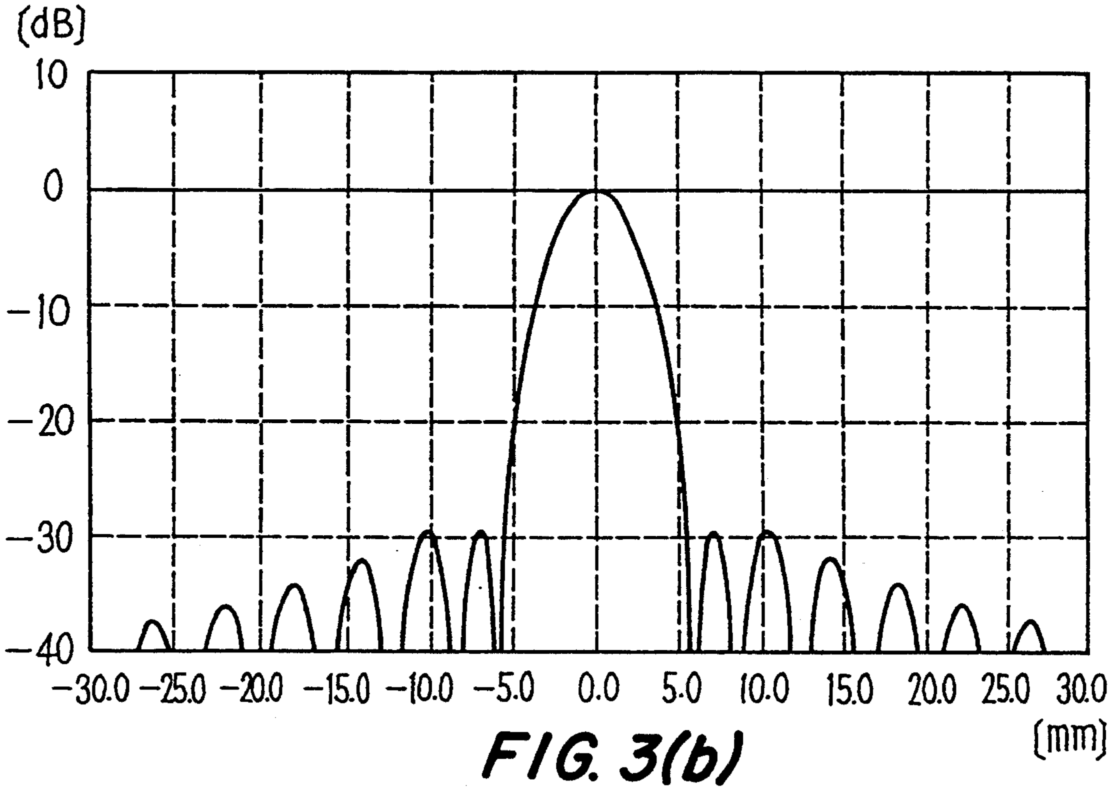
Figure 4A:
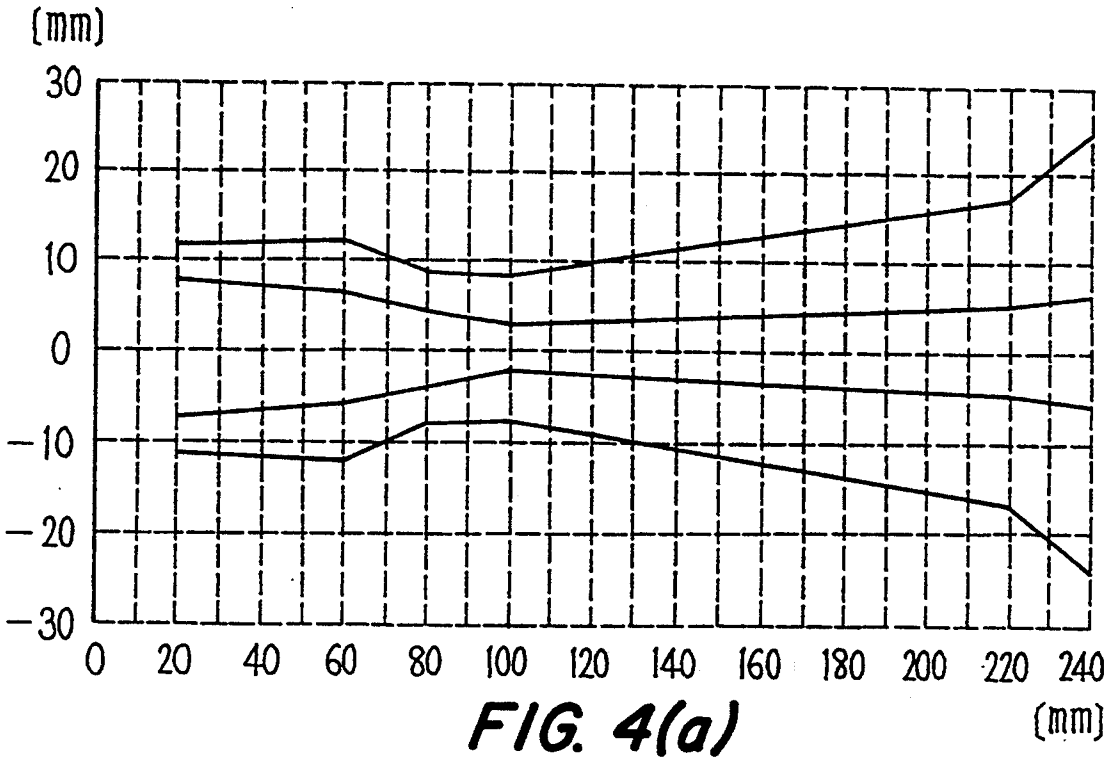
FIGS. 4(*a*) and 4(*b*) are diagrams for explaining acoustic pressure when an ultrasonic transducer in polarization without shading is employed.
Figure 4B:
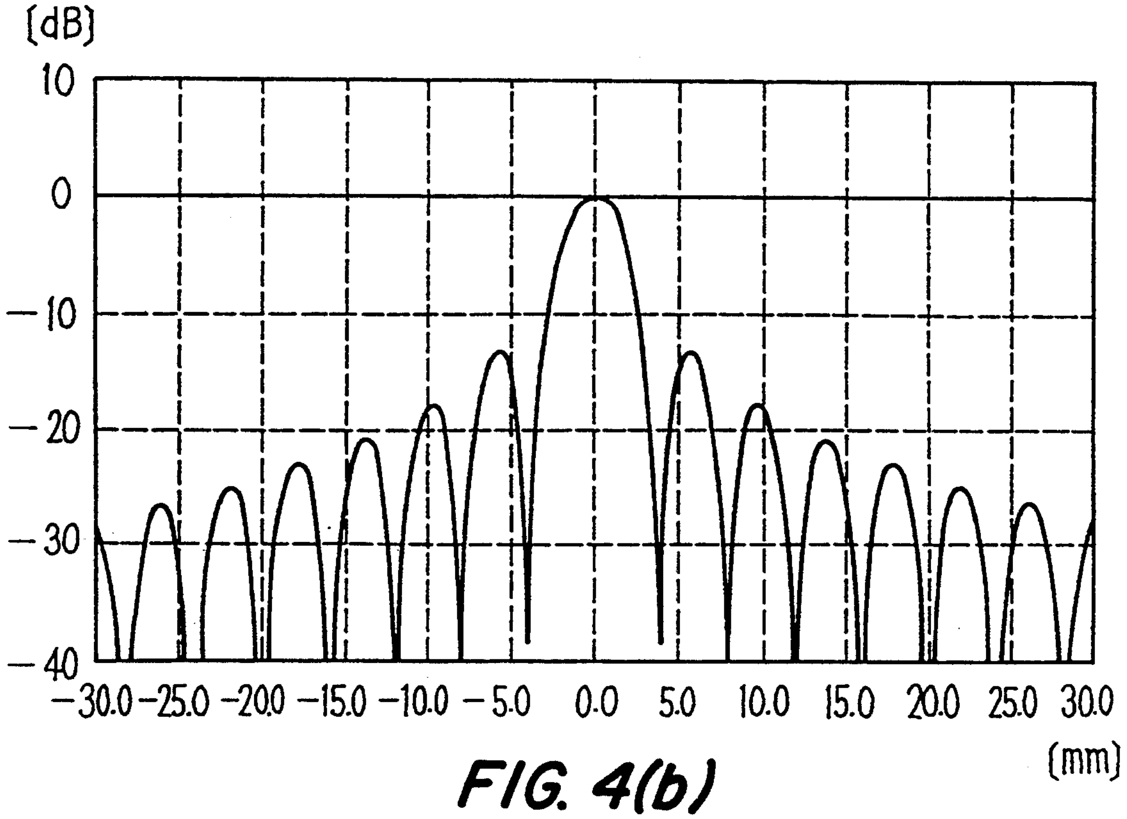
Figure 5:
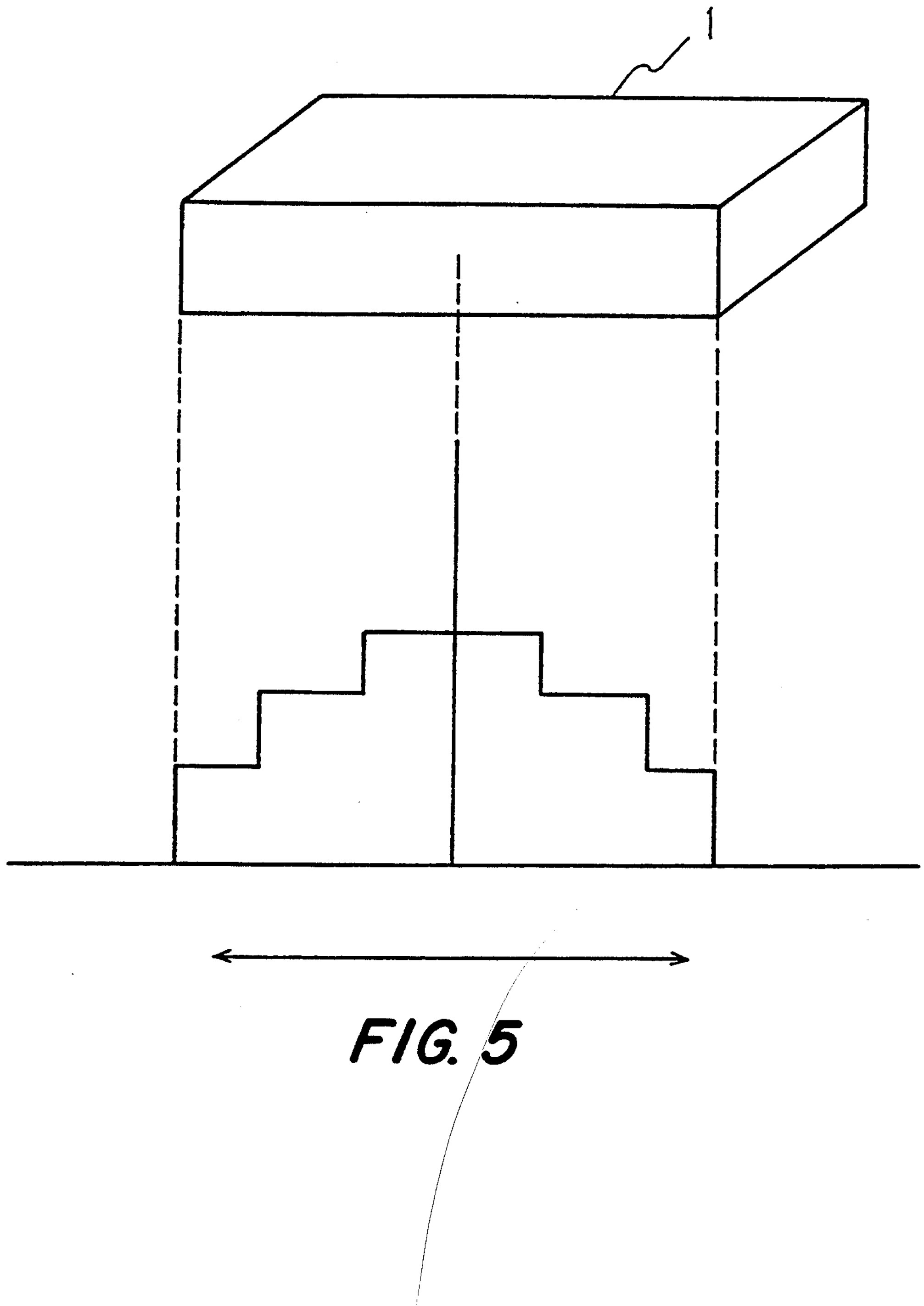
FIG. 5 is a diagram for explaining the principle of the present invention.
Figure 10:
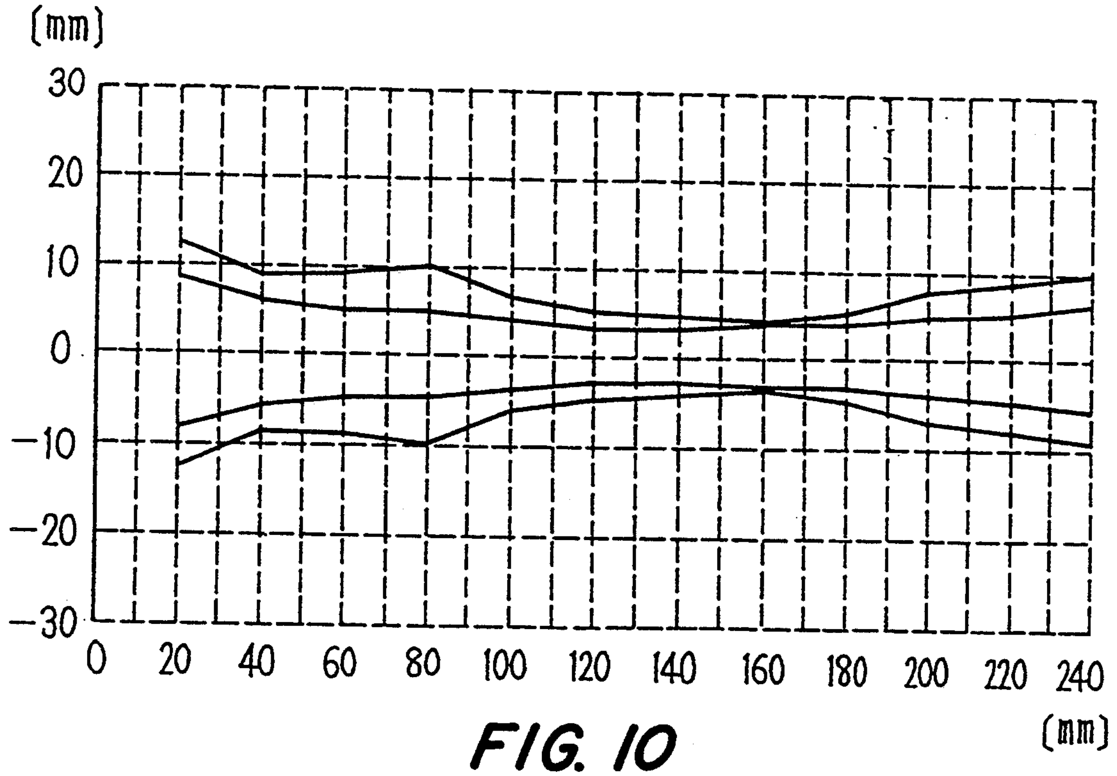
FIG. 10 is a graph of acoustic beam profile for a large aperture.
Figure 11:
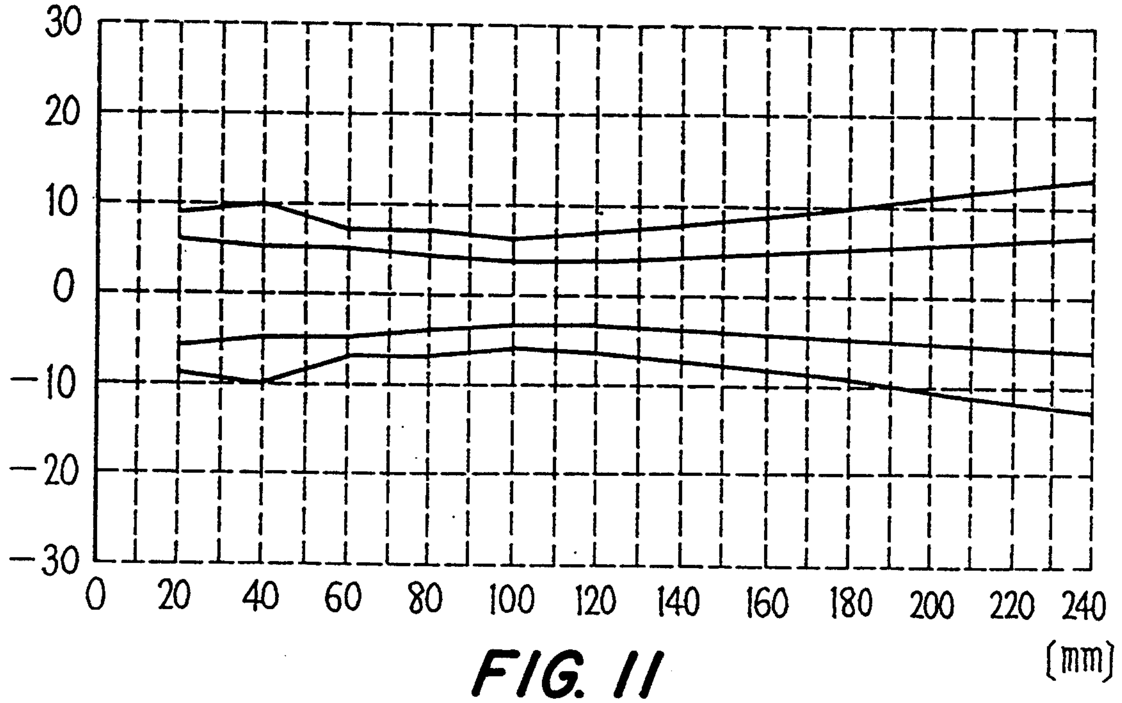
FIG. 11 is a graph of acoustic beam profile for a small aparture.
Figure 12:
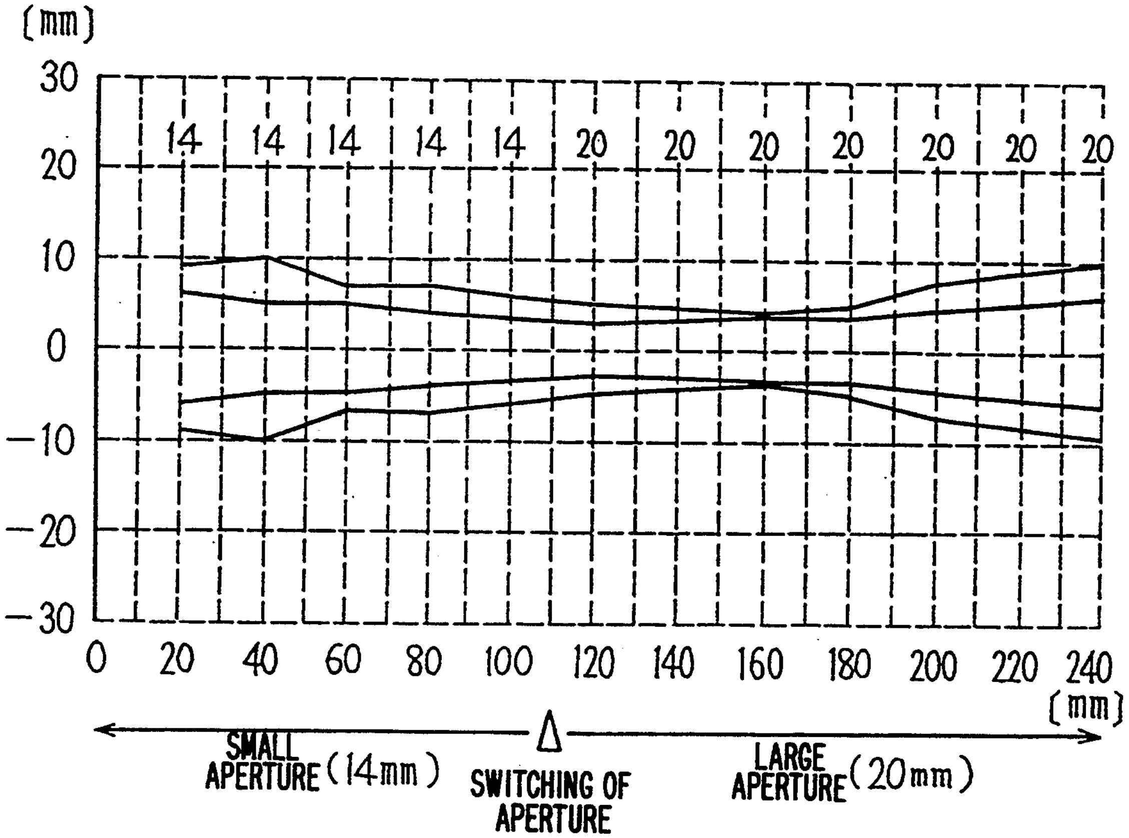
FIG. 12 is a diagram for explaining acoustic beam profile for polarization in three staircases under the aperture control.

FIG. 10 shows a graph of acoustic pressure distribution of beam for a large aperture (in the same way as FIG. 3). In this case, the aperture is the size of 20 mm. FIG. 11 shows a graph of acoustic pressure distribution of beam for small aperture (in the same way as FIG. 3). In this case, the aperture is the size of 14 mm. As shown in FIG. 10, in the case of large aperture, the beam is narrowed at the point comparatively far from the vibrators and in the case of small aperture, the beam is narrowed at the point comparatively near the vibrators. In FIG. 12 (indicated in the same way as FIG. 3), the large and small aperture is switched at the distance of 110 mm. For the distance of 110 mm or less, the small aperture is set and for the distance of 110 mm or longer, the large aperture is set. In the case of use through the switching, it is understood that the beam is narrowed almost for the entire area of distance.

Figure 13:
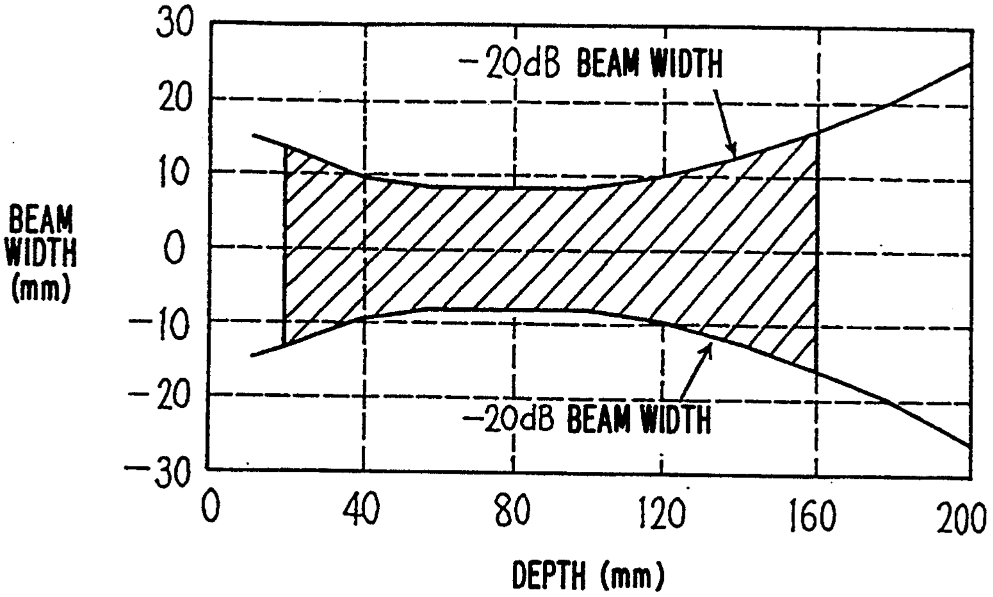
FIG. 13 is a diagram for explaining beam area.

Next, the number of staircases of polarization will be explained using FIG. 13, FIG. 14 and FIG. 15 considering an example using as frequency of 3.5 MHz and aperture of 15 mm. As an evaluation parameter for deciding the optimum number of staircases of polarization, the beam area of −20 dB at the depth between 20 mm to 160 mm shown in FIG. 16 is used. It is indicated in FIG. 13. Namely, evaluation is made using the beam area of the shaded portion of FIG. 13.

Figure 14:
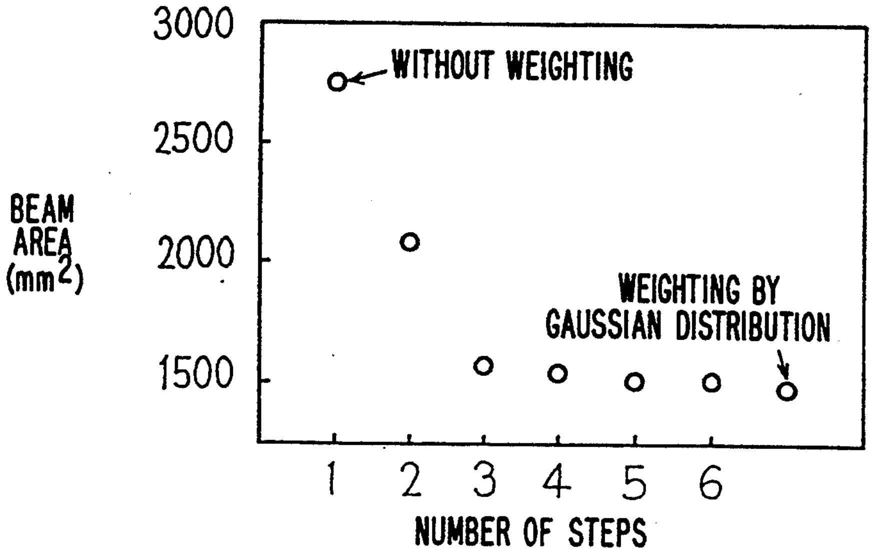
FIG. 14 is a diagram indicating relationship between beam area and number of staircases.

FIG. 14 shows the area where the beam area becomes minimum in each staircase obtained by conducting the simulation through by changing width and height of staircase so that the beam area defined in FIG. 13 becomes minimum. In FIG. 14, when the shading is made in two staircases, the beam area may be improved by 27% in comparison with the case where the shading is not carried out. When the shading is made in three or more staircases, the beam area which is almost similar to that of Gaussian function can be obtained and it is improved by about 45% in comparison with the case where the shading is not carried out. From above description, it can be understood that the beam may be improved with the shading of two or more staircases.

Figure 15:
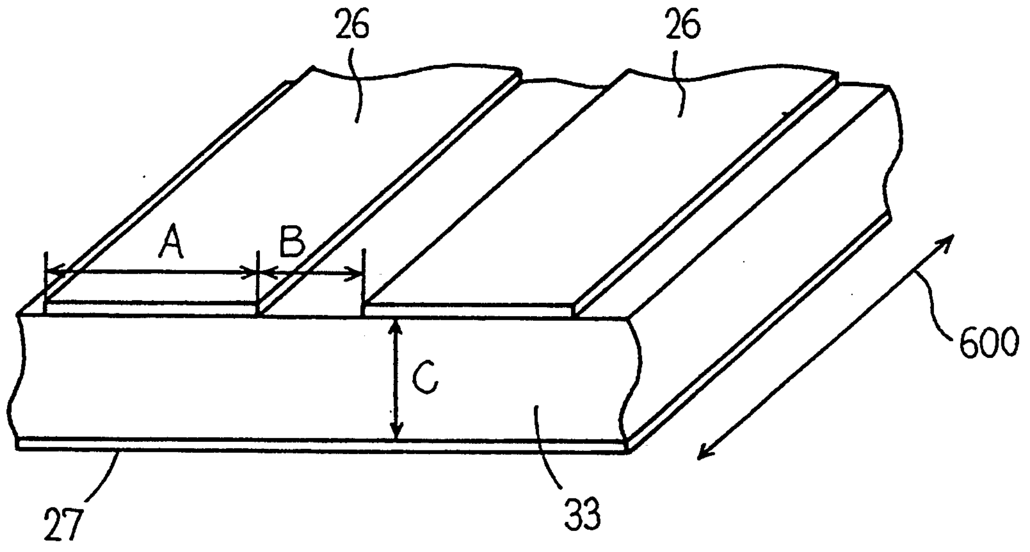
FIG. 15 is a diagram for explaining electrodes and interval between electrodes.
Figure 16A:
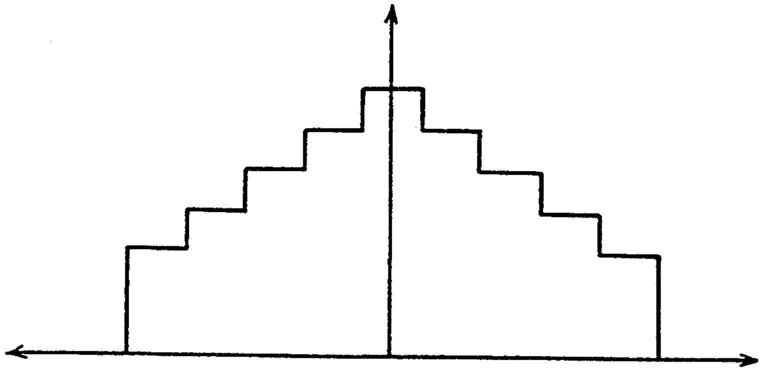
FIGS. 16(*a*) and 16(*b*) are diagrams indicating the shading function when polarization is carried out on the conductors of the equal width and the acoustic beam profile (b) used in this case.
Figure 16B:
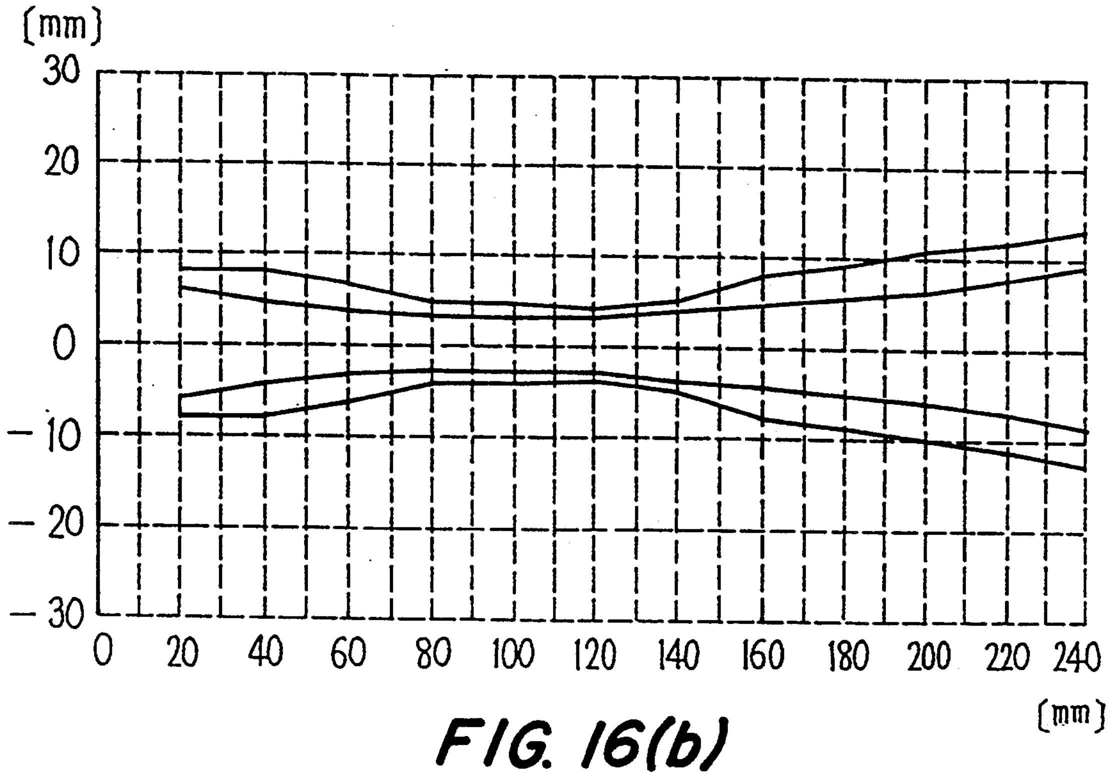

FIG. 15 is a diagram for explaining electrodes and electrode interval. Numeral 600 denotes the arrangement direction of vibrators. The electrode interval B is substantially an unpolarized area. Therefore narrow interval is more desirable from the view point of efficiency of piezoelectric element and acoustic beam profile, and it is desirable that such interval is suppressed to ½ or less of the electrode width A which is substantially polarized. However, when the interval B is too narrow, the conductor discharges at the time of polarization because a potential difference of voltages applied to the adjacent two conductors 26 is large. This discharging is never generated, however, when the electrode interval B is set larger than the elevation of element. In the case of a transducer in frequency of 3.5 MHz and aperture of 15 mm which is generally used for ordinary diagnostic operation, since elevation C of element is 0.45 mm, the 11 electrodes for polarization are used, namely the shading of six staircases is conducted. In this explanation, the frequency is set, for example, to 3.5 MHz and this explanation is also applied to the other frequencies for diagnostic operation. Therefore, the practical range in number of staircases of shading in the present invention is set to 2 to 6 staircases.

Next, an embodiment in which polarization intensity is changed in the staircase function and the staircase width is formed by two or more different widths will then be explained using FIGS. 16(*a*), 16(*b*), 17(*a*) and 17(*b*). FIG. 16(*a*) indicates the shading function in case the polarization is carried out by attaching conductors in the equal width (the vertical axis indicates electromechanical coupling coefficient and the horizontal axis indicates elevation direction of arranged vibrators), while FIG. 16(*b*) indicates the acoustic beam profile (in the same way as FIG. 3). In FIG. 16(*a*), the ratios of electromechanical coupling coefficients of the first, second, third, fourth and fifth steps are 1:0.85:0.7:0.55:0.4.

Figure 17A:
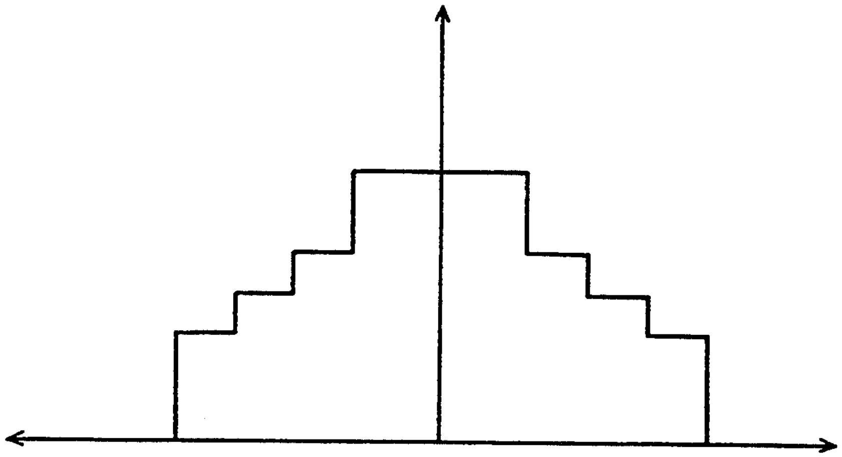
FIGS. 17(*a*) and 17(*b*) are diagrams indicating the shading function when polarization is carried out by widening the width of center electrode and the acoustic beam profile used in this case.
Figure 17B:
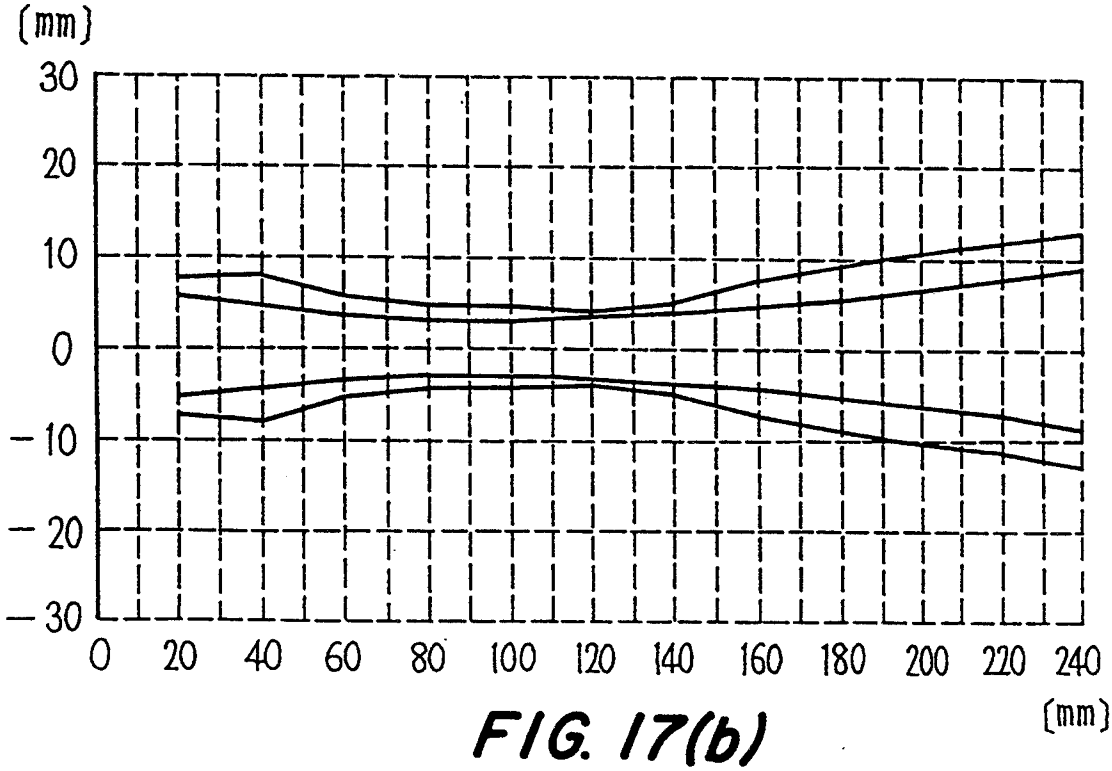

FIG. 17(*a*) shows a shading function where the same shading used for the center is also made to the second highest staircase. In addition, the staircase width of center is widened, namely the staircase function is formed by two different two kinds of widths (the vertical axis indicates the electromechanical coupling coefficient and the horizontal axis indicates elevation direction of arranged vibrators), and FIG. 17(*b*) indicates the acoustic beam profile (in the same manner as FIG. 3). In FIG. 17(*a*), the electromechanical coupling coefficient ratios of the first, second, third, fourth and fifth staircases are set to 1:0.85:0.7:0.55:0.4.

The acoustic beam profile of FIG. 16(*b*) and FIG. 17(*b*) are almost similar by comparison thereof. Polarization with the function widening the center in FIG. 17(*a*) (two kinds of staircase widths are used) provides the following effect in comparison with the polarization by attaching the conductors in almost the equal width shown in FIG. 16(*a*). First, the number of staircases of shading can be reduced and manufacturing becomes easier. Second, the portion in which the vibrator is sufficiently polarized is conducted in a wider area and the electrode interval B shown in FIG. 15 is also reduced in the area. Thereby, total effect can be improved.

While the present invention has been explained above with reference to the embodiment thereof, the present invention surely allows various changes or modification conforming to the claims thereof.

As explained previously, the present invention is capable of obtaining the beam width similar to that conforming to the Gaussian function from the point of view of characteristic by realizing the shading in the staircase function. Moreover, in comparison with the uniform polarization, the transducer may be manufactured easily by only increasing a little or small number of manufacturing steps.

What is claimed is:

1. An ultrasonic transducer having a plurality of arranged vibrators, each having a center and end portions, said plurality of arranged vibrators formed by piezoelectric materials, wherein polarization of the piezoelectric materials of said plurality of arranged vibrators is conducted using a staircase function to gradually reduce the polarization in steps from the centers of said plurality of arranged vibrators to the end portions in a direction orthogonally crossing an arrangement direction of the plurality of arranged vibrators.

2. An ultrasonic transducer according to claim 1, wherein said plurality of vibrators include an aperture which is switched by dividing the plurality of arranged vibrators into a plurality of sections in the direction orthogonally crossing the arrangement direction of the plurality of arranged vibrators and then selecting any one of the plurality of sections.

3. An ultrasonic transducer according to claim 2, wherein a polarization intensity which changes the polarization using the staircase function to be applied to said piezoelectric material is changed in a range from 2 to 6 steps.

4. An ultrasonic transducer according to claim 1, wherein a polarization intensity which changes the polarization using the staircase function to be applied to said piezoelectric material is changed in a range from 2 to 6 steps.

5. A method of manufacturing an ultrasonic transducer including a piezoelectric material having first and second surfaces, said first surface having a center and end portions, comprising the steps of:

(a) providing good conductors with intervals using a first process to the first surface of the piezoelectric material;

(b) providing a uniform conductor using a second process to the second surface opposite said first surface; and (c) applying a voltage using a third process which is reduced in steps using a staircase function to the good conductors located at the center of said first surface to the good conductors located at the end portions among the good conductors provided to said first surface.

6. A method of manufacturing an ultrasonic transducer according to claim 2, wherein a polarization intensity which changes the polarization using the staircase function to be applied to said piezoelectric material is changed in a range from 2 to 6 steps.

7. An ultrasonic transducer comprising arranged vibrators formed by piezoelectric materials and each having a center and end portions, wherein polarization of the piezoelectric materials of said arranged vibrators is reduced in steps using a staircase function utilizing a staircase width from the centers of said arranged vibrators to the end portions in a direction orthogonally crossing an arrangement direction of the arranged vibrators and the staircase width of said arranged vibrators is set to at least two kinds of different widths.

* * * * *

UNITED STATES PATENT AND TRADEMARK OFFICE
CERTIFICATE OF CORRECTION

PATENT NO. : 5,350,964

DATED : SEPTEMBER 27, 1994

INVENTOR(S) : Yasushi HARA, et al.

It is certified that error appears in the above-identified patent and that said Letters Patent is hereby corrected as shown below:

TITLE PAGE [57] ABSTRACT, line 4, "provide" should be --provides--.

Col. 1, line 39, "3(a), (b)." should be --3(a), 3(b).--;
line 59, "FIG." should be --FIGS.--;
line 63, "the-beam" should be --the beam--.

Col. 2, line 32, "portions or" should be --portions;--.

Col. 4, line 43, "(b)" should be deleted.

Col. 8, line 50, "claim 2," should be --claim 5,--.

Signed and Sealed this

Twenty-seventh Day of December, 1994

Attest:

Bruce Lehman

BRUCE LEHMAN

*Attesting Officer*

*Commissioner of Patents and Trademarks*